US009056333B2

(12) United States Patent
Osawa

(10) Patent No.: US 9,056,333 B2
(45) Date of Patent: Jun. 16, 2015

(54) ULTRASOUND PROBE AND METHOD OF PRODUCING THE SAME

(75) Inventor: Atsushi Osawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 361 days.

(21) Appl. No.: 13/584,102

(22) Filed: Aug. 13, 2012

(65) Prior Publication Data

US 2013/0076208 A1 Mar. 28, 2013

(30) Foreign Application Priority Data

Sep. 27, 2011 (JP) ................................. 2011-210290
Sep. 27, 2011 (JP) ................................. 2011-210471

(51) Int. Cl.
*H01L 41/09* (2006.01)
*B06B 1/06* (2006.01)

(52) U.S. Cl.
CPC ........... *B06B 1/064* (2013.01); *Y10T 29/49005* (2013.01)

(58) Field of Classification Search
USPC .................. 310/322, 326, 327, 334, 365, 366
See application file for complete search history.

(56) References Cited

U.S. PATENT DOCUMENTS

| | | | | |
|---|---|---|---|---|
| 7,288,069 | B2 | 10/2007 | Takeuchi et al. | |
| 8,469,894 | B2 * | 6/2013 | Ishidai | 600/459 |
| 8,471,440 | B2 * | 6/2013 | Nakatani et al. | 310/340 |
| 8,531,178 | B2 * | 9/2013 | Sasaki | 324/76.49 |
| 8,784,319 | B2 * | 7/2014 | Ishidai et al. | 600/459 |
| 8,803,404 | B2 * | 8/2014 | Kwon et al. | 310/334 |
| 2008/0253102 | A1 * | 10/2008 | Kuroda | 361/803 |
| 2010/0176688 | A1 * | 7/2010 | Jin et al. | 310/327 |
| 2011/0121687 | A1 * | 5/2011 | Aoki | 310/334 |
| 2011/0198968 | A1 | 8/2011 | Sato et al. | |

FOREIGN PATENT DOCUMENTS

| | | | | |
|---|---|---|---|---|
| JP | 63-108299 U | | 7/1988 | |
| JP | 11-155863 A | | 6/1999 | |
| JP | 2000-351066 A | | 12/2000 | |
| JP | 2001-298795 A | | 10/2001 | |
| JP | 2002-352877 A | | 12/2002 | |
| JP | WO2009/069379 | * | 10/2008 | G01R 23/00 |
| JP | 2010-233224 A | | 10/2010 | |
| JP | 2011-10794 A | | 1/2011 | |
| WO | WO 2010/131394 A1 | | 11/2010 | |

OTHER PUBLICATIONS

Japanese Office Action issued on Aug. 6, 2013 in corresponding Japanese patent application No. 2011-210290 (partial translation is provided).

Japanese Office Action, dated Oct. 1, 2013, for Japanese Application No. 2011-210471 with a partial English translation.

* cited by examiner

*Primary Examiner* — Thomas Dougherty
(74) *Attorney, Agent, or Firm* — Birch, Stewart, Kolasch & Birch, LLP

(57) ABSTRACT

An ultrasound probe includes a backing member, inorganic piezoelectric elements arranged on a top surface of the backing member, an acoustic matching layer disposed on and extending over the inorganic piezoelectric elements, and organic piezoelectric elements arranged on the acoustic matching layer.

17 Claims, 8 Drawing Sheets

ULTRASOUND PROBE AND METHOD OF PRODUCING THE SAME

BACKGROUND OF THE INVENTION

The present invention relates to an ultrasound probe and a method of producing the same and in particular to an ultrasound probe comprising a plurality of inorganic piezoelectric elements and a plurality of organic piezoelectric elements layered on each other and a method of producing the same.

Conventionally, ultrasound diagnostic apparatus using ultrasound images are employed in medicine. Generally, an ultrasound diagnostic apparatus of this type transmits an ultrasonic beam from an ultrasound probe into a subject, receives an ultrasound echo from the subject with the ultrasound probe, and electrically processes the resulting reception signals to produce an ultrasound image.

In recent years, attention is paid to harmonic imaging whereby a harmonic component, which is generated as ultrasonic waveforms deform due to non-linearity of the subject, is received and visualized to give more accurate diagnosis.

JP 11-155863 A, for example, proposes an example as an ultrasound probe appropriate for use in harmonic imaging comprising inorganic piezoelectric elements each using an inorganic piezoelectric body made of a material such as lead zirconate titanate (PZT) and organic piezoelectric elements each using an organic piezoelectric body made of a material such as polyvinylidene fluoride (PVDF), such that the inorganic piezoelectric elements and the organic piezoelectric elements are layered over each other.

The inorganic piezoelectric elements can transmit a higher output ultrasonic beam, and organic piezoelectric elements can receive a harmonic signal with high sensitivity.

The inorganic piezoelectric elements and the organic piezoelectric elements are layered on each other through the intermediary of an acoustic matching layer for efficient transmission of ultrasonic waves. Conventionally, the acoustic matching layer is severed into a plurality of pieces corresponding to a plurality of inorganic piezoelectric elements so that the organic piezoelectric elements are disposed on the respective severed acoustic matching layers. Thus, the inorganic piezoelectric elements and the organic piezoelectric elements are provided in the same number of channels and at the same pitch. With such configuration, grating lobes are liable to occur as the organic piezoelectric elements receive a high-order harmonic component, possibly resulting in a lower image quality.

Each organic piezoelectric element has a signal electrode layer connected to a surface of the corresponding organic piezoelectric body. A signal line extension electrode extended from the signal electrode layer is connected by, for example, welding to a wiring pattern provided on a circuit board constituting a reception circuit. The reception signal obtained by the organic piezoelectric element is acquired by the reception circuit via the signal line extension electrode.

However, an organic piezoelectric body generally has such a low heat resistance that it depolarizes at a temperature over 80° C. Therefore, it has been a problem that remains to be solved to reduce the amount of heat conducted to the organic piezoelectric body via the signal line extension electrode generated when the signal line extension electrode is connected by, for example, welding to the wiring pattern provided on the circuit board. The problem has been especially important when a large number of organic piezoelectric elements are arrayed in a compact space.

SUMMARY OF THE INVENTION

An object of the present invention is to eliminate the above problems associated with the prior art and provide an ultrasound probe and a method of producing the same capable of producing a high quality ultrasound image with a configuration such that inorganic piezoelectric elements and organic piezoelectric elements are layered on each other.

Another object of the invention is to provide an ultrasound probe and a method of producing the same enabling easy connection of signal line extension electrodes to external connection lines while reducing the amount of heat conducted to an organic piezoelectric body.

An ultrasound probe according to a first aspect of the invention comprises: a backing member; inorganic piezoelectric elements arrayed on a top surface of the backing member; an acoustic matching layer disposed on and extending over the inorganic piezoelectric elements; and organic piezoelectric elements arrayed on the acoustic matching layer.

A method of producing an ultrasound probe according to a second aspect of the invention comprises the steps of: forming inorganic piezoelectric elements on a top surface of the backing member; joining an acoustic matching layer extending over the inorganic piezoelectric elements onto the inorganic piezoelectric elements; and forming an array of organic piezoelectric elements on the acoustic matching layer.

An ultrasound probe according to a third aspect of the invention is an ultrasound probe comprises: the steps of: organic piezoelectric elements arranged in an array; and signal line extension electrodes extended outwards from organic piezoelectric elements and each having a connection portion formed therein, the connection portion having a shape for improving wettability for an electric connection material having fluidity.

A method of producing an ultrasound probe according to a fourth aspect of the invention comprises the steps of:

forming signal line extension electrodes in an array on a top surface of an insulation sheet and forming in each of the signal line extension electrodes a connection portion having a shape for improving wettability for an electric connection material having fluidity;

joining a rear surface of the insulation sheet onto the top surface of the acoustic matching layer so that part of the signal line extension electrodes protrudes from the top surface of the acoustic matching layer;

bending the part of the signal line extension electrodes protruding from the acoustic matching layer along a lateral surface of the acoustic matching layer together with the insulation sheet; and forming organic piezoelectric elements on the signal line extension electrodes disposed on a top surface of the acoustic matching layer through an intermediary of the insulation sheet.

A method of producing an ultrasound probe according to a fifth aspect of the invention comprises the steps of:

disposing a sacrificial layer adjacent to an acoustic matching layer;

forming a conductive layer on top surfaces of the acoustic matching layer and the sacrificial layer;

dicing the conductive layer at a given pitch in a direction perpendicular to a boundary between the acoustic matching layer and the sacrificial layer to form signal electrode layers and signal line extension electrodes integrally connected to the signal electrode layers;

forming a connection portion having a shape for improving wettability for an electric connection material having fluidity in each of the signal line extension electrodes located on a boundary between the acoustic matching layer and the sacrificial layer;

removing the sacrificial layer and bending the part of the signal line extension electrodes protruding from the acoustic matching layer along a lateral surface of the acoustic matching layer together with the insulation sheet; and forming organic piezoelectric elements on the signal electrode layers disposed on the top surface of the acoustic matching layer.

DETAILED DESCRIPTION OF THE INVENTION

Embodiments of the present invention will now be described below based on the appended drawings.

Embodiment 1

Figure 1:
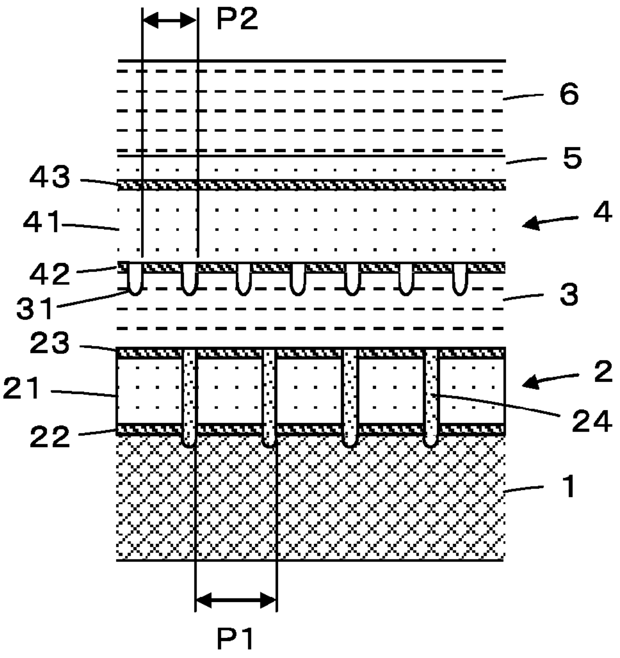
FIG. 1 is a cross sectional view illustrating a configuration of an ultrasound probe according to Embodiment 1 of the invention.
Figure 2:
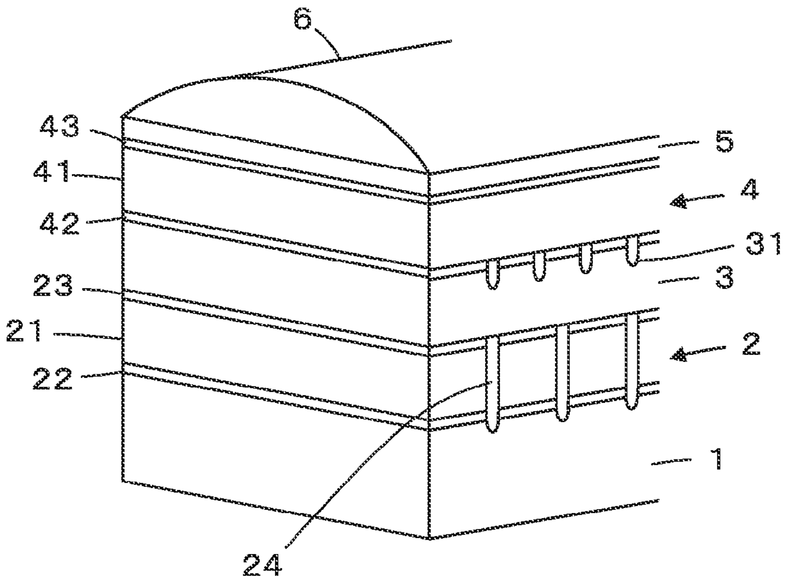
FIG. 2 is a partial perspective view illustrating the ultrasound probe according to Embodiment 1.

FIGS. 1 and 2 illustrate a configuration of an ultrasound probe according to Embodiment 1 of the invention.

A plurality of inorganic piezoelectric elements 2 are arranged at a pitch of P1 on the top surface of a backing member 1. The inorganic piezoelectric elements 2 comprise a plurality of inorganic piezoelectric bodies 21 separately provided from each other. A signal electrode layer 22 is joined to one face of each of the inorganic piezoelectric bodies 21 and a ground electrode layer 23 is joined to the other face of each of the inorganic piezoelectric bodies 21. Thus, each inorganic piezoelectric element 2 comprises a dedicated inorganic piezoelectric body 21, a dedicated signal electrode layer 22, and a dedicated ground electrode layer 23. Each gap between adjacent inorganic piezoelectric elements 2 is filled with a filler 24.

An acoustic matching layer 3 is joined onto the inorganic piezoelectric elements 2. The acoustic matching layer 3 extends over the whole piezoelectric elements 2 without being severed into a plurality of pieces.

On the acoustic matching layer 3, there are disposed a plurality of organic piezoelectric elements 4. The organic piezoelectric elements 4 comprise a common organic piezoelectric body 41 extending throughout the organic piezoelectric elements 4 without being severed into a plurality of pieces. A plurality of separately disposed signal electrode layers 42, corresponding to the organic piezoelectric elements 4, are joined onto the surface of the organic piezoelectric body 41 opposing to the acoustic matching layer 3, and a common ground electrode layer 43 extending over the whole organic piezoelectric elements 4 is joined onto the whole surface of the organic piezoelectric body 41 opposite from the acoustic matching layer 3. Each of the signal electrode layers 42 is separated from the adjacent signal electrode layer 42 by a groove 31 formed in a surface portion of the acoustic matching layer 3.

Thus, each of the organic piezoelectric elements 4 comprises a dedicated signal electrode layer 42 and the organic piezoelectric body 41 common to the plurality of the organic piezoelectric elements 4 and the ground electrode layer 43 common to the plurality of the organic piezoelectric elements 4. Therefore, an arrangement pitch of the organic piezoelectric elements 4 is determined only by a pitch at which the signal electrode layers 42 joined onto the surface of the organic piezoelectric body 41 are arranged. In Embodiment 1, the signal electrode layers 42 are arranged at the pitch P2 that is smaller than a pitch P1 at which the inorganic piezoelectric elements 2 are arranged. Thus, the organic piezoelectric elements 4 arranged at the pitch P2 are constituted.

Further, an acoustic lens 6 is joined onto the organic piezoelectric elements 4 through the intermediary of a protection layer 5.

The inorganic piezoelectric bodies 21 of the inorganic piezoelectric elements 2 are formed of piezoelectric ceramic typified by lead zirconate titanate (PZT) or piezoelectric monocrystal typified by a lead magnesium niobate lead titanate solid solution (PMN-PT). The organic piezoelectric body 41 of the organic piezoelectric elements 4 is a polymeric piezoelectric element made of, for example, polyvinylidene fluoride (PVDF) or polyvinylidene fluoride-trifluoroethylene copolymer.

The backing member 1 supports the inorganic piezoelectric elements 2 and absorbs ultrasonic waves discharged backwards. It may be made of a rubber material such as ferrite rubber.

The acoustic matching layer 3 is provided to allow an ultrasonic beam emitted from the inorganic piezoelectric elements 2 to efficiently enter a subject and is formed of a material having an acoustic impedance value between that of the inorganic piezoelectric elements 2 and that of an organism under observation.

The protection layer 5 protects the ground electrode layer 43 of the organic piezoelectric elements 4 and is made of, for example, polyvinylidene fluoride (PVDF).

The acoustic lens 6 focuses an ultrasonic beam using refraction in order to improve the resolution in an elevational direction. The acoustic lens 6 is formed of, for example, silicon rubber.

In the operation, for example, the inorganic piezoelectric elements 2 are used as oscillators provided exclusively for transmission of ultrasonic waves while the organic piezoelectric elements 4 are used as oscillators provided exclusively for reception of ultrasonic waves.

Application of a voltage in the form of pulses or a continuous wave between the signal electrode layers 22 and the ground electrode layers 23 of the inorganic piezoelectric elements 2 causes the inorganic piezoelectric bodies 21 of the inorganic piezoelectric elements 2 to expand and contract, generating ultrasonic waves in the form of pulses or a continuous wave. The ultrasonic waves pass through the acoustic matching layer 3, the organic piezoelectric elements 4, the protection layer 5, and the acoustic lens 6 to enter a subject, where the ultrasonic waves are combined to each other to form an ultrasonic beam, which propagates inside the subject.

When an ultrasonic echo from the subject enters the individual organic piezoelectric elements 4 through the acoustic lens 6 and the protection layer 5, the organic piezoelectric body 41 expands and contracts in sensitive response to the harmonic component of the ultrasonic echo, generating electric signals between the signal electrode layers 42 and the ground electrode layer 43 to output the electric signals as reception signals.

Based on the reception signals outputted from the organic piezoelectric elements 4, a harmonic image can be produced.

The inorganic piezoelectric elements 2 may be used as oscillators for both transmission and reception of the ultrasonic waves. In that case, an ultrasonic echo received by the organic piezoelectric elements 4 through the acoustic lens 6 and the protection layer 5 further travels through the organic piezoelectric elements 4 and the acoustic matching layer 3 to enter the individual inorganic piezoelectric elements 2, whereupon the inorganic piezoelectric bodies 21 expand and contract in response mainly to the fundamental component of the ultrasonic echo, generating electric signals between the signal electrode layers 22 and the ground electrode layers 23.

Thus, one may produce a compound image in which the fundamental component and the harmonic components are combined based on the reception signals corresponding to the fundamental component obtained by the inorganic piezoelectric elements 2 and the reception signals corresponding to the harmonic components obtained by the organic piezoelectric elements 4.

Because the organic piezoelectric elements 4 are arranged at the pitch P2 that is smaller than the pitch P1 at which the inorganic piezoelectric elements 2 are arranged, grating lobes do not readily occur even if the organic piezoelectric elements 4 receive high-order harmonic components. Therefore, a high quality ultrasound image can be produced.

Figure 3A:
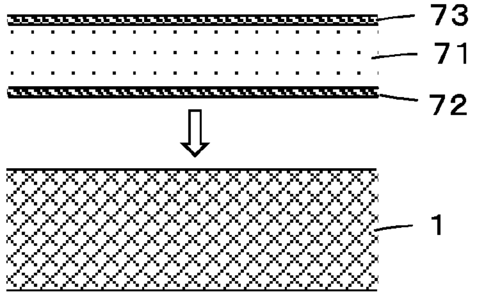
FIGS. 3A to 3E are cross sectional views illustrating stepwise a method of producing the ultrasound probe according to Embodiment 1.

Such an ultrasound probe as described above can be produced as follows:

First, as illustrated in FIG. 3A, an inorganic piezoelectric body 71 extending over the whole area of the backing member 1 and provided over the whole surface thereof on respective sides with conductive layers 72 and 73, is joined onto the surface of the backing member 1 with, for example, an adhesive.

Figure 3B:
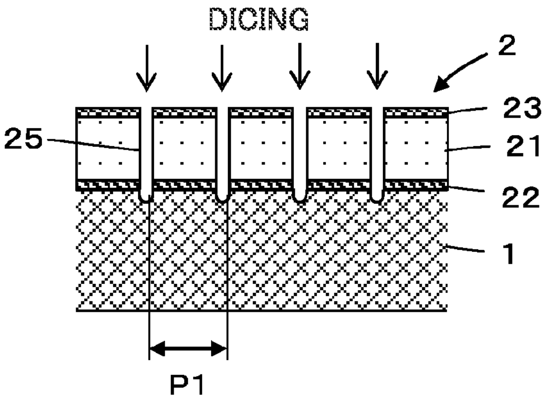

Next, as illustrated in FIG. 3B, the inorganic piezoelectric body 71 and the conductive layers 72 and 73 are diced at the pitch P1 to form the inorganic piezoelectric elements 2 arranged on the top surface of the backing member 1 at the pitch P1. In order for the conductive layer 72 lying between the inorganic piezoelectric body 71 and the backing member 1 to be severed throughout its thickness, dicing is done through the top surface portion of the backing member 1, so that the individual inorganic piezoelectric elements 2 are severed from the adjacent inorganic piezoelectric elements 2 by grooves 25.

Figure 3C:
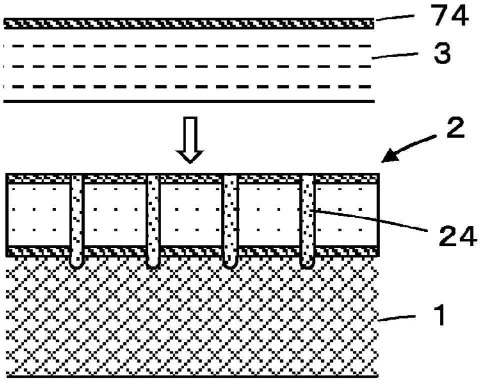

After the grooves 25 thus formed between adjacent inorganic piezoelectric elements 2 are filled with the filler 24 to fix the positions and postures of the respective inorganic piezoelectric elements 2 as illustrated in FIG. 3C, the acoustic matching layer 3 is joined onto the inorganic piezoelectric elements 2. The acoustic matching layer 3 is large enough to extend over the whole inorganic piezoelectric elements 2 and previously provided with a conductive layer 74 on the whole surface thereof opposite from its surface facing the inorganic piezoelectric elements 2.

Figure 3D:
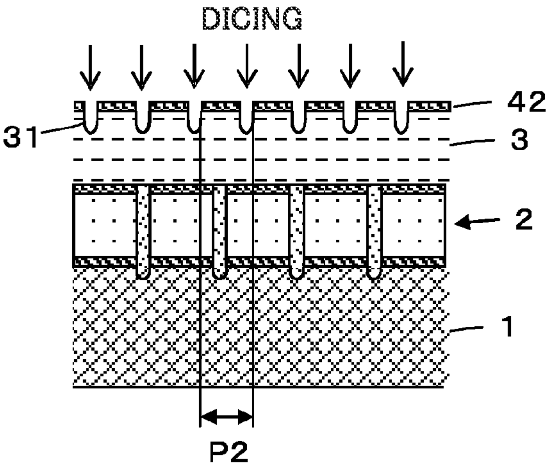

Next, as illustrated in FIG. 3D, the conductive layer 74 is diced at the pitch P2 to form a plurality of signal electrode layers 42 arranged on the top surface of the acoustic matching layer 3 at the pitch P2 so as to correspond to the organic piezoelectric elements 4. In order for the conductive layer 74 to be severed at the pitch P2 throughout its thickness, dicing is done through the top surface portion of the acoustic matching layer 3, so that the individual signal electrode layers 42 are severed from adjacent signal electrode layers 42 by grooves 31.

Figure 3E:
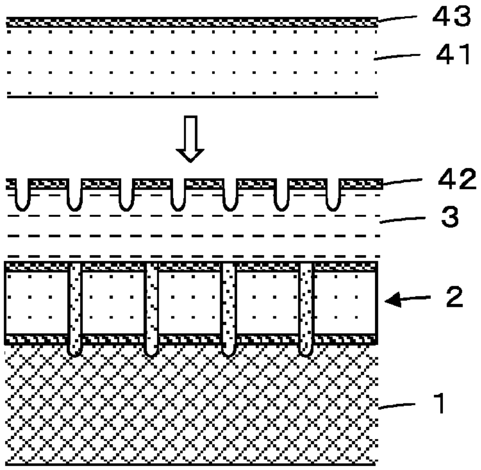

Further, the organic piezoelectric body 41 is joined onto the signal electrode layers 42 with, for example, a conductive adhesive as illustrated in FIG. 3E. The organic piezoelectric body 41 is large enough to extend over the whole signal electrode layers 42 and previously provided with the ground electrode layer 43 on the whole surface thereof opposite from the signal electrode layers 42. Thus, the organic piezoelectric elements 4 arranged at the pitch P2 are formed.

Thereafter, the acoustic lens 6 is joined onto the ground electrode layer 43 of the organic piezoelectric elements 4 through the intermediary of the protection layer 5 to fabricate the ultrasound probe as illustrated in FIGS. 1 and 2.

Thus, the acoustic matching layer 3, not severed into a plurality of pieces, is large enough to extend over the whole inorganic piezoelectric elements 2, and the organic piezoelectric elements 4 have the common organic piezoelectric body 41 and the common ground electrode layer 43 each extending throughout the organic piezoelectric elements 4. Therefore, the pitch P2 of the organic piezoelectric elements 4 can be set freely with great ease simply by dicing the conductive layer 74 illustrated in FIG. 3D at a desired pitch.

The arrangement pitch P2 of the organic piezoelectric elements 4 is not limited in any manner by the arrangement pitch P1 of the inorganic piezoelectric elements 2 and determined only by the pitch at which the conductive layer 74 is diced.

This enables easy production of an ultrasound probe having an optimum structure for an intended use and generation of a high quality ultrasound image.

While the signal electrode layers 42 are formed by dicing the conductive layer 74 provided over the whole surface of the acoustic matching layer 3, the invention is not limited thereto. The signal electrode layers 42 may alternatively be formed by patterning a conductive layer over the whole surface of the acoustic matching layer 3 at a desired pitch.

While the acoustic matching layer 3 previously provided on the surface thereof with the conductive layer 74 is joined onto the inorganic piezoelectric elements 2, the invention is not limited thereto. The acoustic matching layer 3 may be first joined onto the inorganic piezoelectric elements 2, and the conductive layer 74 may be thereafter formed on the surface of the acoustic matching layer 3.

While the organic piezoelectric body 41 previously provided on the top surface thereof with the ground electrode layer 43 is joined onto the signal electrode layers 42, the organic piezoelectric body 41 may be first joined onto the inorganic piezoelectric elements 2, followed by formation of the ground electrode layer 43 on the top surface of the organic piezoelectric body 41.

Figure 4:
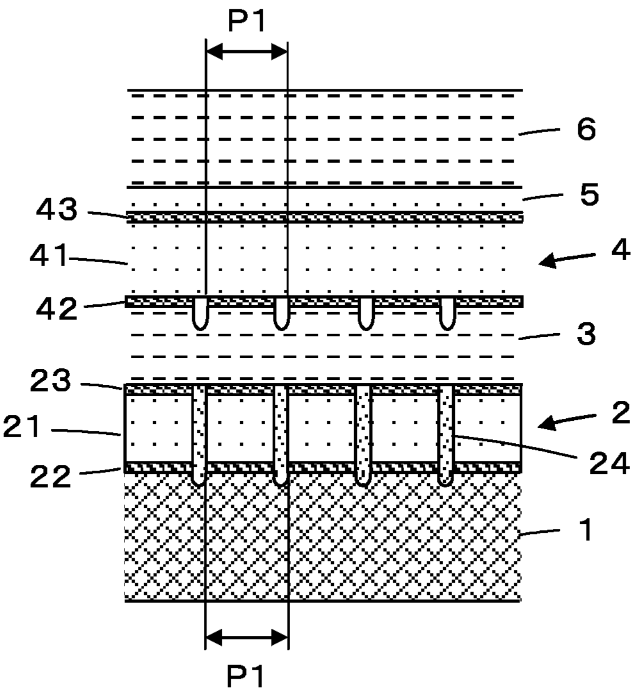
FIG. 4 is a cross sectional view illustrating a configuration of an ultrasound probe according to a variation of Embodiment 1.

The organic piezoelectric elements 4 need not necessarily be disposed at a pitch smaller than the arrangement pitch P1 of the inorganic piezoelectric elements 2. For example, the organic piezoelectric elements 4 may be disposed at the same pitch P1 as the inorganic piezoelectric elements 2 as illustrated in FIG. 4. Further, the organic piezoelectric elements 4 may be disposed at a greater pitch than the arrangement pitch P1 of the inorganic piezoelectric elements 2.

Embodiment 2

Figure 5:
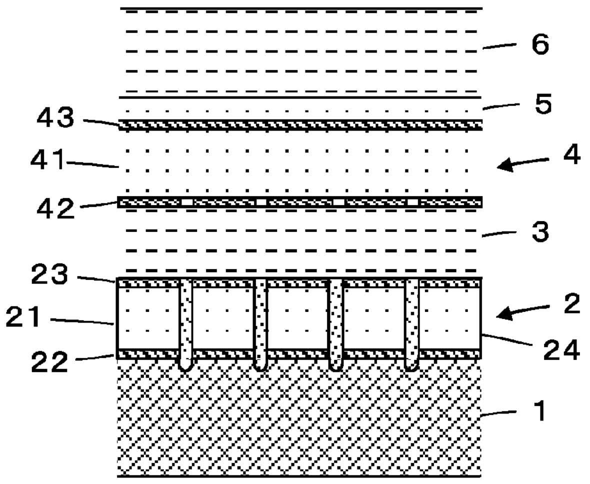
FIG. 5 is a cross sectional view illustrating a configuration of an ultrasound probe according to Embodiment 2.

FIG. 5 illustrates a configuration of an ultrasound probe according to Embodiment 2.

The inorganic piezoelectric elements 2 are arranged on the top surface of the backing member 1. The inorganic piezoelectric elements 2 comprise a plurality of inorganic piezoelectric bodies 21 separately from each other. A signal electrode layer 22 is joined to one face of each of the inorganic piezoelectric bodies 21 and a ground electrode layer 23 is joined to the other face of each of the inorganic piezoelectric bodies 21. Thus, each inorganic piezoelectric element 2 comprises a dedicated inorganic piezoelectric body 21, a signal electrode layer 22, and a ground electrode layer 23. Each gap between adjacent inorganic piezoelectric elements 2 is filled with the filler 24.

The acoustic matching layer 3 is joined onto the inorganic piezoelectric elements 2. The acoustic matching layer 3 is not severed into a plurality of pieces in coincidence with the inorganic piezoelectric elements 2 but extends over the whole piezoelectric elements 2.

On the acoustic matching layer 3, there are disposed a plurality of organic piezoelectric elements 4. The organic piezoelectric elements 4 comprise the common organic piezoelectric body 41 extending throughout the organic piezoelectric elements 4 without being severed into a plurality of pieces. A plurality of separately disposed signal electrode layers 42 so as to correspond to the organic piezoelectric elements 4 are joined onto the surface of the organic piezoelectric body 41 opposing to the acoustic matching layer 3, and a common ground electrode layer 43 extending over the organic piezoelectric elements 4 is joined onto the whole surface of the organic piezoelectric elements 41 opposite from the acoustic matching layer 3.

Further, the acoustic lens 6 is joined onto the organic piezoelectric elements 4 through the intermediary of the protection layer 5.

The inorganic piezoelectric bodies 21 of the inorganic piezoelectric elements 2 are formed of piezoelectric ceramic typified by lead zirconate titanate (PZT) or piezoelectric monocrystal typified by a lead magnesium niobate lead titanate solid solution (PMN-PT). The organic piezoelectric body 41 of the organic piezoelectric elements 4 is a polymeric piezoelectric element made of, for example, polyvinylidene fluoride (PVDF) or polyvinylidene fluoride-trifluoroethylene copolymer.

Figure 6:
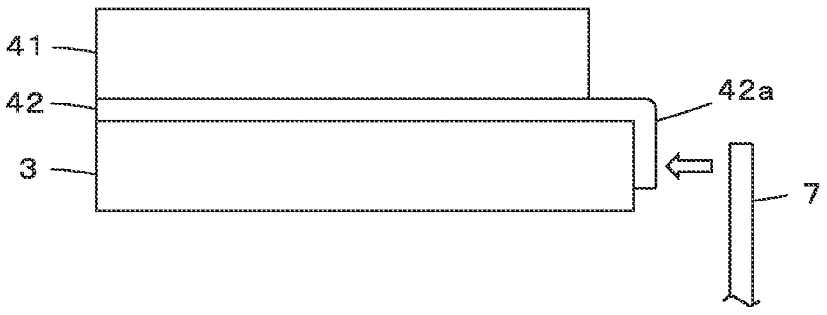
FIG. 6 is a side view illustrating major portions of the ultrasound probe according to Embodiment 2.

As illustrated in FIG. 6, the signal electrode layers 42 of the organic piezoelectric elements 4 each extend from one end of the organic piezoelectric body 41 to the other end and farther to the outside of the organic piezoelectric body 41 to form the signal line extension electrodes 42*a*, which are bent from the top surface of the acoustic matching layer 3 so as to contour the lateral surface thereof. The signal line extension electrodes 42*a* are to be connected by welding or other means to connection lines 7 connected to a circuit board forming the reception circuit.

Figure 7:
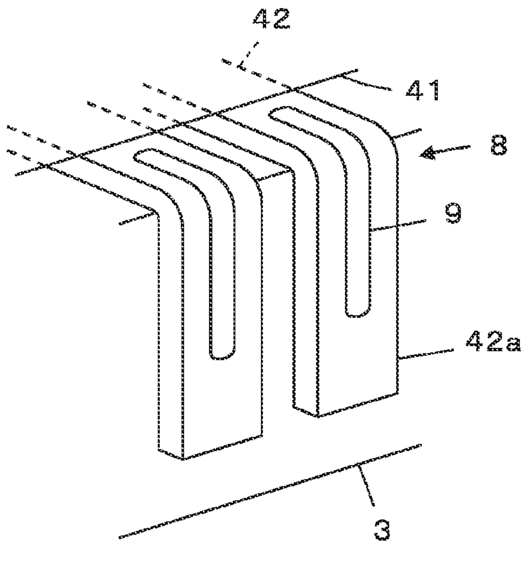
FIG. 7 is a partial perspective view illustrating signal line extension electrodes of the ultrasound probe according to Embodiment 2.

Each of the signal line extension electrodes 42*a* has in its upper surface a connection portion 9 in the form of a groove along the longitudinal direction of the signal line extension electrode 42*a* in a bent portion 8 bent so as to contour the acoustic matching layer 3 as illustrated in FIG. 7. The connection portion 9 is provided to improve wettability of the signal line extension electrodes 42*a* for an electric connection material having fluidity such as molten solder.

For use of the ultrasound probe, the signal electrode layers 22 of the inorganic piezoelectric elements 2 are connected by welding or other means to their respective connection lines that are in turn connected to the circuit board constituting a transmission circuit and a reception circuit, neither shown, whereas the signal electrode layers 42 of the organic piezoelectric elements 4 are connected by welding or other means to their respective connection lines that are in turn connected to the circuit board constituting the reception circuit, not shown.

The organic piezoelectric body 41 generally has such a low heat resistance that consideration is required not to allow a large amount of heat to be conducted to the organic piezoelectric body 41 when the signal electrode layers 42 of the organic piezoelectric elements 4 are connected by welding or other means to the connection lines of the circuit board. In the ultrasound probe in Embodiment 2, however, the signal line extension electrodes 42*a* extending outwards from the respective signal electrode layers 42 each have in the top surface thereof the connection portion 9 in the form of a groove.

Therefore, the signal line extension electrodes 42*a* acquire an improved wettability such that the capillarity helps molten solder to permeate the signal line extension electrodes 42*a*, allowing welding to be completed in a short period of time. Accordingly, the connection between the signal line extension electrodes 42*a* and the connection lines of the circuit board can be achieved without the organic piezoelectric body 41 being adversely affected even if a large number of organic piezoelectric elements 4 are arrayed in high density.

When the ultrasound probe is in operation, for example, the inorganic piezoelectric elements 2 are used as oscillators exclusively for transmission of ultrasonic waves while the organic piezoelectric elements 4 are used as oscillators exclusively for reception of ultrasonic waves.

Application of a voltage in the form of pulses or a continuous wave between the signal electrode layers 22 and the ground electrode layers 23 of the inorganic piezoelectric elements 2 causes the inorganic piezoelectric bodies 21 of the inorganic piezoelectric elements 2 to expand and contract, generating ultrasonic waves in the form of pulses or a continuous wave. The ultrasonic waves pass through the acoustic matching layer 3, the organic piezoelectric elements 4, the protection layer 5, and the acoustic lens 6 to enter a subject, where the ultrasonic waves are combined to each other to form an ultrasonic beam, which propagates inside the subject.

When an ultrasonic echo from the subject enters the individual organic piezoelectric elements 4 through the acoustic lens 6 and the protection layer 5, the organic piezoelectric body 41 expands and contracts in sensitive response to the harmonic component of the ultrasonic echo, generating electric signals between the signal electrode layers 42 and the ground electrode layer 43 to output the electric signals as reception signals via the signal line extension electrodes 42*a*.

Based on the reception signals outputted from the organic piezoelectric elements 4, a harmonic image can be produced.

The inorganic piezoelectric elements 2 may be used as oscillators for both transmission and reception of the ultrasonic waves. In that case, an ultrasonic echo received by the organic piezoelectric elements 4 through the acoustic lens 6 and the protection layer 5 further travels through the organic piezoelectric elements 4 and the acoustic matching layer 3 to enter the individual inorganic piezoelectric elements 2, whereupon the inorganic piezoelectric bodies 21 expand and contract in response mainly to the fundamental component of the ultrasonic echo, generating electric signals between the signal electrode layers 22 and the ground electrode layers 23.

Thus, one may produce a compound image in which the fundamental component and the harmonic components are combined based on the reception signals corresponding to the fundamental component obtained by the inorganic piezoelectric elements 2 and the reception signals corresponding to the harmonic components obtained by the organic piezoelectric elements 4.

Such an ultrasound probe as described above can be produced as follows:

First, the inorganic piezoelectric elements 2 are formed in an array on the top surface of the backing member 1, and thereafter the acoustic matching layer 3 is joined onto the inorganic piezoelectric elements 2.

Figure 8A:
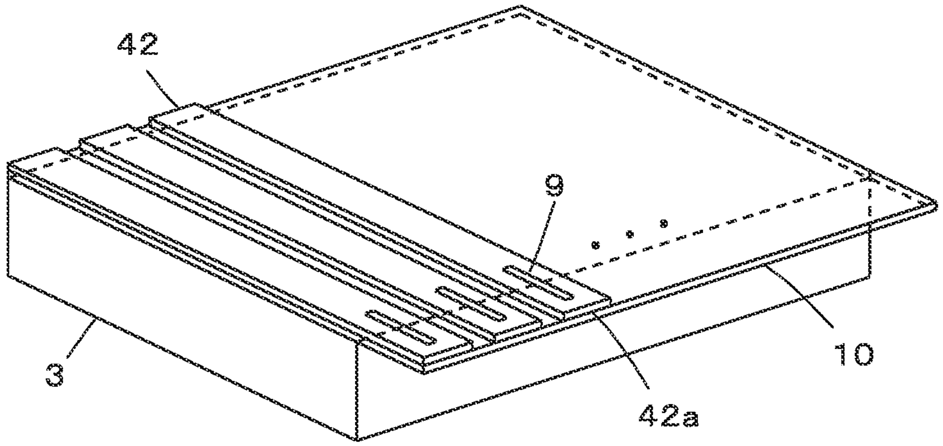
FIGS. 8A and 8B illustrate stepwise a method of producing the signal line extension electrodes of the ultrasound probe according to Embodiment 2.

As illustrated in FIG. 8A, the signal electrode layers 42 and the signal line extension electrodes 42*a* integrally connected to the respective signal electrode layers 42 are arranged on the top surface of an insulation sheet 10, and the connection portion 9 in the form of a groove is formed in the top surface of each of the signal line extension electrodes 42*a*. The signal electrode layers 42 and the signal line extension electrodes 42*a* may be formed by, for example, patterning a conductive layer formed over the whole surface of the insulation sheet 10 by wet etching.

Then, the insulation sheet 10 is positioned in relation to the acoustic matching layer 3 so that part of the signal line extension electrodes 42*a* protrudes from the top surface of the acoustic matching layer 3, and the rear surface of the insulation sheet 10 is joined onto the top surface of the acoustic matching layer 3.

Figure 8B:
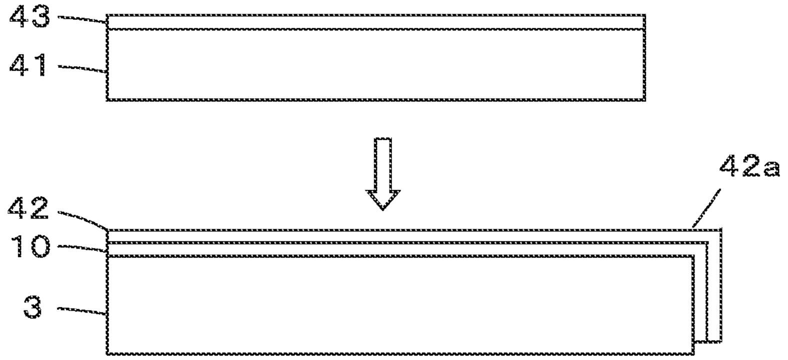

As illustrated in FIG. 8B, part of each of the signal line extension electrodes 42*a* protruding from the top surface of the acoustic matching layer 3 is bent together with the insulation sheet 10 so as to contour the lateral surface of the acoustic matching layer 3, whereupon the organic piezoelectric body 41 large enough to extend over the whole signal electrode layers 42 is joined onto the signal electrode layers 42 disposed on the surface of the acoustic matching layer 3 through the intermediary of the insulation sheet 10. The organic piezoelectric body 41 is provided with the ground electrode layer 43 previously formed over the whole surface thereof opposite from the signal electrode layers 42, whereby the organic piezoelectric elements 4 are formed in an array.

Then, the acoustic lens 6 is joined onto the ground electrode layer 43 through the intermediary of the protection layer 5 to complete the ultrasound probe as illustrated in FIG. 5.

In the above production method illustrated in FIGS. 8A and 8B, the signal electrode layers 42 of the organic piezoelectric elements 4 and the signal line extension electrodes 42*a* are integrally connected to each other. However, signal line extension electrodes 42*a* separately provided from the signal electrode layers 42 may be electrically connected to the signal electrode layers 42.

Figure 9A:
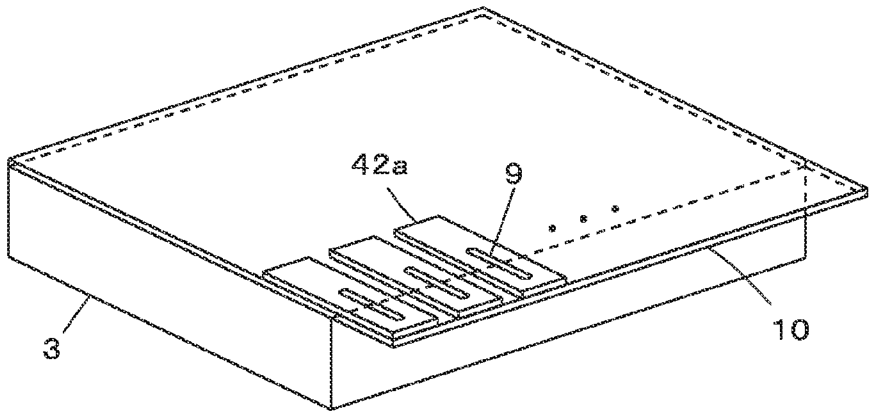
FIGS. 9A and 9B illustrate stepwise a method of producing signal line extension electrodes of an ultrasound probe according to a variation of Embodiment 2.

In that case, as illustrated in FIG. 9A, for example, the signal line extension electrodes 42*a* are formed in an array on the top surface of the insulation sheet 10, and the connection portion 9 in the form of a groove is formed in the top surface of each signal line extension electrode 42*a*. Then, the rear surface of the insulation sheet 10 is joined onto the top surface of the acoustic matching layer 3 so that part of the signal line extension electrodes 42*a* protrudes from the top surface of the acoustic matching layer 3.

Figure 9B:
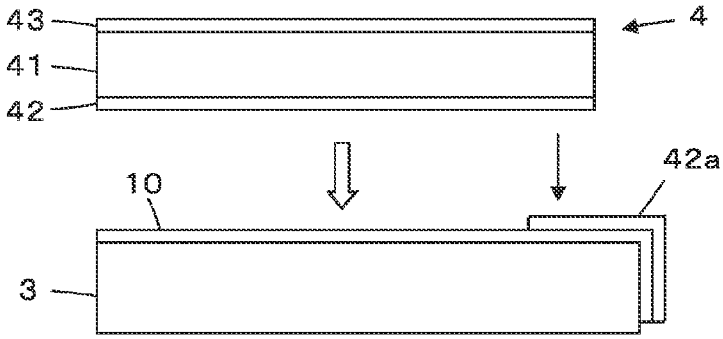

As illustrated in FIG. 9B, part of each of the signal line extension electrodes 42*a* protruding from the top surface of the acoustic matching layer 3 is bent together with the insulation sheet 10 so as to contour the lateral surface of the acoustic matching layer 3, whereupon the organic piezoelectric elements 4, previously fabricated, are joined onto the signal line extension electrodes 42*a* disposed on the top surface of the acoustic matching layer 3 through the intermediary of the insulation sheet 10.

The organic piezoelectric elements 4 comprise the common organic piezoelectric body 41 extending throughout the organic piezoelectric elements 4, the signal electrode layers 42 disposed on one surface of the organic piezoelectric body 41 and separated from each other, and the common ground electrode layer 43 disposed on the other surface of the organic piezoelectric body 41 and extending throughout the length of the organic piezoelectric elements 4. The signal electrode layers 42 are arranged at the same pitch as the signal line extension electrodes 42*a* formed in an array on the top surface of the insulation sheet 10.

Then, the organic piezoelectric elements 4 are joined onto the signal line extension electrodes 42*a* and the insulation sheet 10 using, for example, a conductive adhesive so that the respective signal electrode layers 42 are in contact with the corresponding signal line extension electrodes 42*a*.

Thus, the ultrasound probe may also be produced by a method comprising, in the process, electrically connecting the separately provided signal electrode layers 42 and signal line extension electrodes 42*a*. Also with this ultrasound probe, wherein the signal line extension electrodes 42*a* each have the groove-like connection portion 9 in the top surface thereof, soldering the signal line extension electrodes 42*a* to the connection lines of the circuit board can be accomplished in a short period of time.

Embodiment 3

Figure 10:
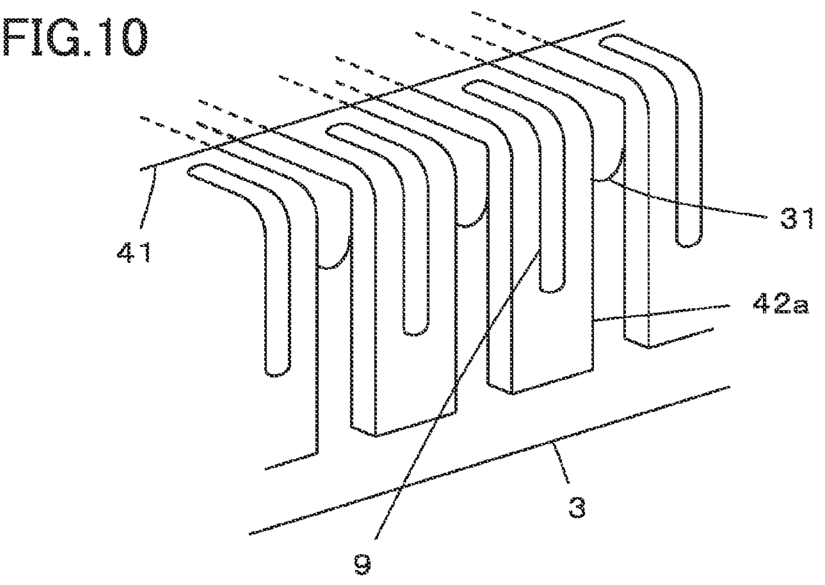
FIG. 10 is a partial perspective view illustrating signal line extension electrodes of an ultrasound probe according to Embodiment 3.

FIG. 10 illustrates the signal line extension electrodes 42*a* and the neighborhood thereof of the ultrasound probe according to Embodiment 3. In the ultrasound probe in Embodiment 3, the acoustic matching layer 3 according to Embodiment 2 additionally comprises a plurality of grooves 31 formed between adjacent signal line extension electrodes 42*a* in the top surface thereof where the acoustic matching layer 3 is in contact with the signal line extension electrodes 42*a*. Thus, adjacent signal line extension electrodes 42*a* are separated by the grooves 31.

Separating adjacent signal line extension electrodes 42*a* with the grooves 31 facilitates soldering of the individual signal line extension electrodes 42*a* and enables quick connection of the signal line extension electrodes 42*a* and the connection lines of the circuit board without adversely affecting the organic piezoelectric body 41 even if numerous organic piezoelectric elements 4 are arrayed in high density.

Figure 11A:
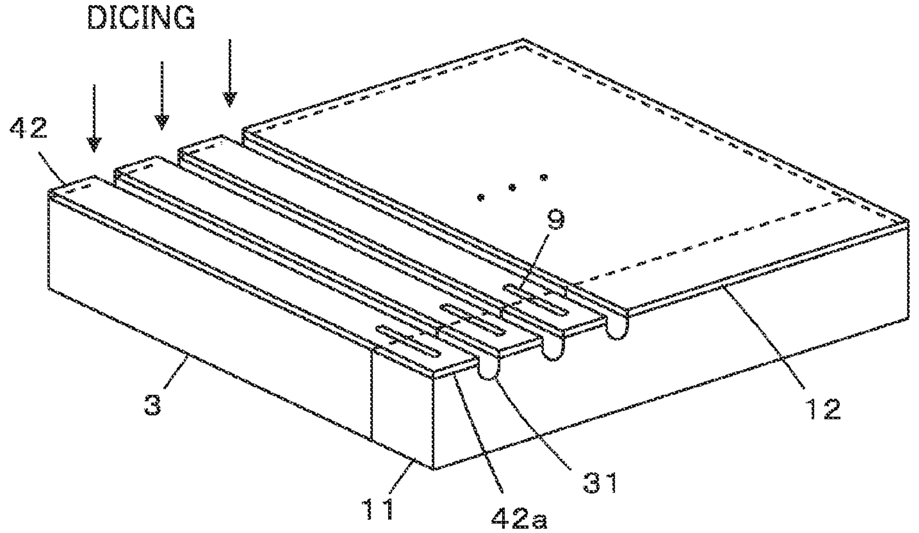
FIGS. 11A to 11C illustrate stepwise a method of producing the signal line extension electrodes of the ultrasound probe according to Embodiment 3.

The ultrasound probe according to Embodiment 3 can be produced as follows:

First, as illustrated in FIG. 11A, a sacrificial layer 11 is disposed adjacent to the acoustic matching layer 3. The sacrificial layer 11 has the same thickness as the acoustic matching layer 3.

Next, a conductive layer 12 is formed over the whole surface of the acoustic matching layer 3 and the sacrificial layer 11 so as to extend over both the acoustic matching layer 3 and the sacrificial layer 11, whereupon the conductive layer 12 is diced at a given pitch in the direction perpendicular to the boundary between the acoustic matching layer 3 and the sacrificial layer 11 to form the signal electrode layers 42 and the signal line extension electrodes 42*a* integrally connected to the signal electrode layers 42 on the top surfaces of the matching layer 3 and the sacrificial layer 11. The individual signal electrode layers 42 are located on the top surface of the acoustic matching layer 3 while the individual signal line extension electrodes 42*a* is located on part of the top surface of the acoustic matching layer 3 and on the sacrificial layer 11.

In order for the conductive layer 12 to be severed at a given pitch throughout the thickness thereof, dicing is done through the top surface portion of the acoustic matching layer 3, so that the individual signal electrode layers 42 and signal line extension electrodes 42*a* are severed from adjacent signal electrode layers 42 and signal line extension electrodes 42*a* by the grooves 31.

Further, the groove-like connection portions 9 are formed in the top surfaces of the individual signal line extension electrodes 42*a*.

Figure 11B:
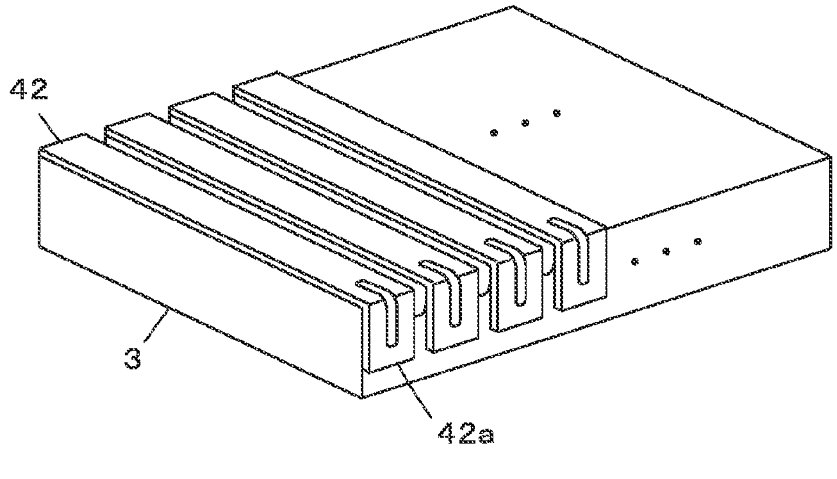
Figure 11C:
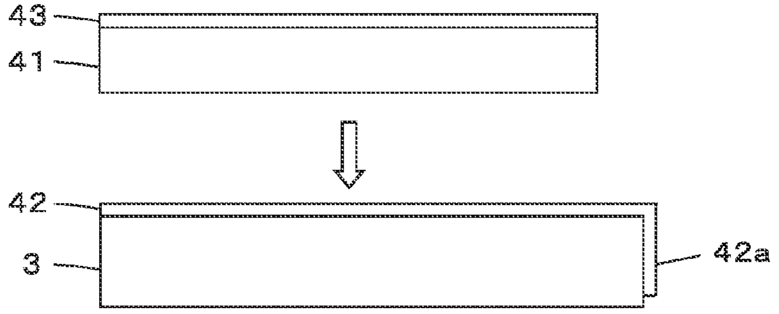

As illustrated in FIG. 11B, the sacrificial layer 11 is removed out, and part of each of the signal line extension electrodes 42*a* protruding from the top surface of the acoustic matching layer 3 is bent so as to contour the lateral surface of the acoustic matching layer 3, whereupon, as illustrated in FIG. 11C, the organic piezoelectric body 41 large enough to extend over the whole signal electrode layers 42 is joined onto the signal electrode layers 42 disposed on the top surface of the acoustic matching layer 3. The organic piezoelectric body 41 is provided with the ground electrode layer 43 previously formed over the whole surface thereof opposite from the surface thereof facing the signal electrode layers 42, whereby the organic piezoelectric elements 4 are formed in an array.

The acoustic matching layer 3 thus fabricated is joined onto the inorganic piezoelectric elements 2 formed in an array on the top surface of the backing member 1, whereupon the protection layer 5 and the acoustic lens 6 are sequentially joined onto the ground electrode layer 43 of the organic piezoelectric elements 4 to produce the ultrasound probe according to Embodiment 3 wherein adjacent signal line extension electrodes 42*a* are separated from each other by the grooves 31.

Embodiment 4

Figure 12:
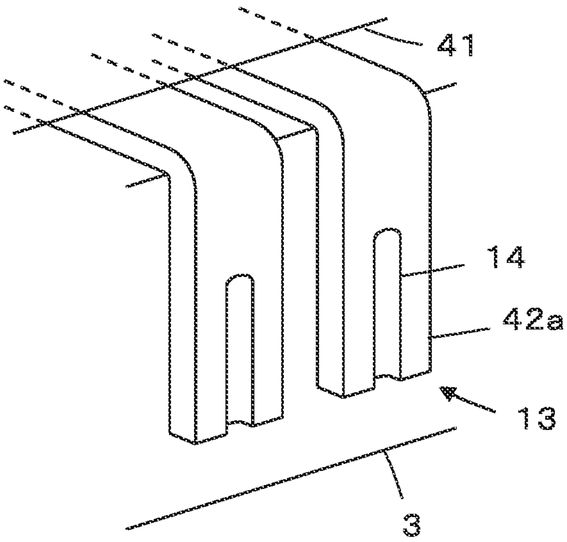
FIG. 12 is a partial perspective view illustrating signal line extension electrodes of an ultrasound probe according to Embodiment 4.

While, in Embodiments 2 and 3, the bent portions 8 of the signal line extension electrodes 42*a* bent along the acoustic matching layer 3 each have the connection portion 9 in the form of a groove, tip portions 13 of the signal line extension electrodes 42*a* lying along the lateral surface of the acoustic matching layer 3 may each have a connection portion 14 in the form of a groove as illustrated in FIG. 12, so that the connection lines connected to the circuit board forming the reception circuit may be connected to the connection portions 14 with molten solder or by other means.

Each of the connection portions may consist of a plurality of grooves instead of a single groove.

Alternatively, a connection portion in the form of a slit or a through-hole instead of a groove may be formed in the bent portion 8 or the tip portion 13 of each of the signal line extension electrodes 42*a*.

As in Embodiments 2 and 3, any of these variations of the connection portion improves the wettability of the signal line extension electrodes 42*a* and facilitates permeation of molten solder into the signal line extension electrodes 42*a* by capillarity, enabling quick soldering of the signal line extension electrodes 42*a* and the connection lines of the circuit board.

Embodiment 5

Figure 13:
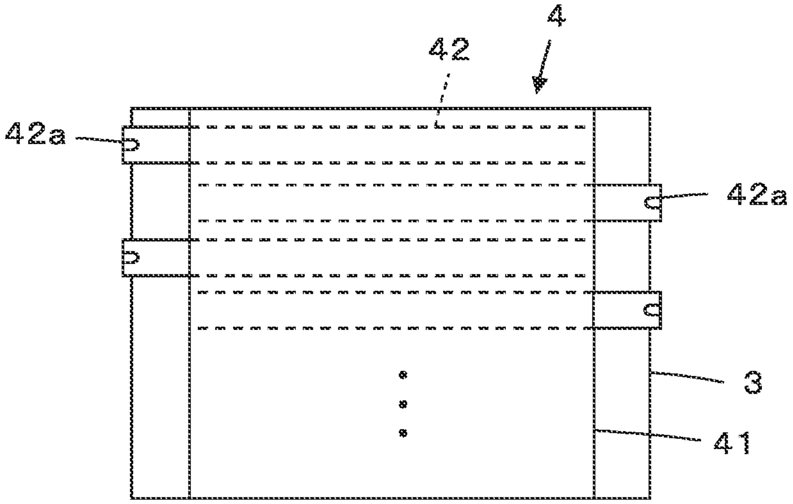
FIG. 13 is a top plan view illustrating signal line extension electrodes of an ultrasound probe according to Embodiment 5.

In Embodiments 2 to 4, the signal line extension electrodes 42*a* may be allowed to extend from the organic piezoelectric elements 4 in opposite directions alternately as illustrated in FIG. 13.

Such configuration widens the gap between adjacent signal line extension electrodes 42*a*, further facilitates soldering of the signal line extension electrodes 42*a*, and enables connection of the signal line extension electrodes 42*a* and the connection lines of the circuit board in a short period of time without adversely affecting the organic piezoelectric body 41 even if numerous organic piezoelectric elements 4 are arrayed in high density.

While, in Embodiments 2 to 5, the signal line extension electrodes 42*a* and the connection lines of the circuit board are connected using molten solder as electric adhesive having fluidity, conductive paste having fluidity with a curing temperature of 80° C. or lower, for example, may be used instead of molten solder. Also in this case, the connection portions provided in the signal line extension electrodes 42*a* improve the wettability of the signal line extension electrodes 42*a* and facilitate permeation of the conductive paste into the signal line extension electrodes 42*a* by capillarity, enabling quick soldering of the signal line extension electrodes 42*a* and the connection lines of the circuit board.

Low-temperature silver paste, for example, has a curing temperature of 50° C. to 60° C. and, when used as conductive paste, allows further reduction in the amount of heat conducted to the organic piezoelectric body 41 when the signal line extension electrodes 42*a* are connected to the connection lines of the circuit board.

Use of such conductive paste is advantageous in that it allows easy correction of wiring.

What is claimed is:

1. An ultrasound probe comprising:
a backing member;
inorganic piezoelectric elements arranged on a top surface of the backing member;
an acoustic matching layer disposed on and extending over the inorganic piezoelectric elements; and
organic piezoelectric elements arranged on the acoustic matching layer,
wherein the organic piezoelectric elements include:
signal electrode layers for organic piezoelectric elements formed on the acoustic matching layer and separated from each other;
an organic piezoelectric body joined onto and extending over the signal electrode layers for organic piezoelectric elements; and
a ground electrode layer for organic piezoelectric elements formed on the organic piezoelectric body,
the signal electrode layers for organic piezoelectric elements being separated from each other by grooves formed in a surface portion of the acoustic matching layer facing the organic piezoelectric elements.

2. The ultrasound probe according to claim 1,
wherein the organic piezoelectric elements comprises:
a common organic piezoelectric body extending throughout the organic piezoelectric elements;
signal electrode layers arranged on a surface of the organic piezoelectric body opposing to the acoustic matching layer and separated from each other; and
a common ground electrode layer disposed on another surface of the organic piezoelectric body and extending over the inorganic piezoelectric elements.

3. The ultrasound probe according to claim 1,
wherein the organic piezoelectric elements are arranged at a pitch that is different from a pitch at which the inorganic piezoelectric elements are arranged.

4. The ultrasound probe according to claim 3, wherein the organic piezoelectric elements are arranged at a pitch that is smaller than the pitch at which the inorganic piezoelectric elements are arranged.

5. The ultrasound probe according to claim 1, wherein the inorganic piezoelectric elements comprises:

inorganic piezoelectric bodies separated from each other; and signal electrode layers for inorganic piezoelectric elements arranged on one side of the inorganic piezoelectric bodies and ground electrode layers for inorganic piezoelectric elements arranged on another side of the inorganic piezoelectric bodies.

6. The ultrasound probe according to claim 5, wherein the inorganic piezoelectric bodies are made of lead zirconate titanate or a lead magnesium niobate lead titanate solid solution.

7. The ultrasound probe according to claim 2, wherein the organic piezoelectric body is made of polyvinylidene fluoride or polyvinylidene fluoride-trifluoroethylene copolymer.

8. The ultrasound probe according to claim 1, further comprising an acoustic lens provided on the organic piezoelectric elements through an intermediary of a protection layer.

9. An ultrasound probe comprising:

organic piezoelectric elements arranged in an array;

an acoustic matching layer disposed on and extending over the organic piezoelectric elements; and signal line extension electrodes extended outwards from organic piezoelectric elements each of the signal line extension electrodes having a bent portion bent from a top surface of the acoustic matching layer so as to contour a lateral surface of the acoustic matching layer and a tip portion lying along the lateral surface of the acoustic matching layer and having a connection portion with a shape for improving wettability for an electric connection material having fluidity formed in the bent portion or the tip portion thereof.

10. The ultrasound probe according to claim 9, wherein the connection portion has a shape that is one of a groove, a slit, and a through-hole.

11. The ultrasound probe according to claim 9, wherein the connection portion has a shape of a groove formed along a longitudinal direction or a tip portion of each of the signal line extension electrodes in the bent portion.

12. The ultrasound probe according to claim 9, further comprising an acoustic matching layer extending over the organic piezoelectric elements, wherein the organic piezoelectric elements comprise a common organic piezoelectric body extending throughout the organic piezoelectric elements, signal electrode layers separated from each other and disposed between one surface of the organic piezoelectric body and the acoustic matching layer, and a common ground electrode layer disposed on the other surface of the organic piezoelectric body and extending over the organic piezoelectric elements, and wherein the signal line extension electrodes extend outwards respectively from the signal electrode layers.

13. The ultrasound probe according to claim 12, wherein the acoustic matching layer has grooves each of which is formed between the signal line extension electrodes adjacent to each other in a top surface thereof that is in contact with the signal line extension electrodes.

14. The ultrasound probe according to claim 12, wherein the signal line extension electrodes extend outwards in opposite directions alternately.

15. The ultrasound probe according to claim 12, wherein the organic piezoelectric body is made of polyvinylidene fluoride or polyvinylidene fluoride-trifluoroethylene copolymer.

16. The ultrasound probe according to claim 9, further comprising inorganic piezoelectric elements arrayed on an opposite side of the acoustic matching layer from the organic piezoelectric elements.

17. The ultrasound probe according to claim 9, wherein the electric connection material is one of molten solder and conductive paste having a curing temperature of 80° C. or lower.

* * * * *